(12) United States Patent
Kwon

(10) Patent No.: US 6,876,065 B2
(45) Date of Patent: Apr. 5, 2005

(54) SEMICONDUCTOR DEVICE AND A FABRICATION METHOD THEREOF

(75) Inventor: Young-Min Kwon, Incheon (KR)

(73) Assignee: Anam Semiconductor Inc., Seoul (KR)

( * ) Notice: Subject to any disclaimer, the term of this patent is extended or adjusted under 35 U.S.C. 154(b) by 0 days.

(21) Appl. No.: 10/794,200

(22) Filed: Mar. 5, 2004

(65) Prior Publication Data

US 2004/0171275 A1 Sep. 2, 2004

Related U.S. Application Data

(62) Division of application No. 10/636,030, filed on Aug. 7, 2003.

(30) Foreign Application Priority Data

Aug. 7, 2002 (KR) ................................. 10-2002-0046579

(51) Int. Cl.$^7$ ............................................... H01L 23/58
(52) U.S. Cl. ....................................... 257/638; 257/639
(58) Field of Search ................................. 257/632, 635, 257/638, 639

(56) References Cited

U.S. PATENT DOCUMENTS

| | | | | |
|---|---|---|---|---|
| 5,100,503 A | * | 3/1992 | Allman et al. | 430/270.1 |
| 6,586,820 B2 | * | 7/2003 | Yin et al. | 257/649 |
| 6,610,616 B2 | * | 8/2003 | Koh et al. | 438/781 |

* cited by examiner

*Primary Examiner*—Hoai Ho
*Assistant Examiner*—Quoc Hoang
(74) *Attorney, Agent, or Firm*—Hanley, Flight & Zimmerman, LLC

(57) ABSTRACT

A semiconductor device and fabrication method thereof that uses a far ultraviolet ray photolithography, which may be used to prevent the lift phenomenon of a photoresist pattern, is disclosed. The semiconductor device may be fabricated by the process of: forming a film which is an object of forming a pattern on a structure of a semiconductor substrate; forming a anti-reflection layer on the film to form a stacking structure including the film and the anti-reflection layer; performing a plasma treatment to form grooves on a upper surface of the stacking structure; forming a photoresist pattern on the stacking structure on which the grooves are formed; and etching the stacking structure using the photoresist pattern as a mask to form a stacking structure pattern.

12 Claims, 2 Drawing Sheets

SEMICONDUCTOR DEVICE AND A FABRICATION METHOD THEREOF

This application is a division of Ser. No. 10/636,030, filed Aug. 7, 2003.

TECHNICAL FIELD

The present disclosure relates to a semiconductor device and a fabrication method thereof and, more particularly, to a photolithography process using a far ultraviolet ray.

BACKGROUND

Recently, because of the development of integration, it is now practical to use large scale integration ("LSI") and very large scale integration ("VLSI") in the fabrication of semiconductor integrated circuits. Furthermore, the minimum pattern of integrated circuit is now at a sub-micron scale, which tends to be a more fine scale one.

In order to form a micro pattern, it is essential to use a photolithography technique in which a photoresist layer is formed on a substrate on which a thin film will be formed, a selective exposure is performed to form a latent image of a desired pattern, a photoresist pattern is made by development, the thin film is etched using the photoresist pattern as a mask, and the desired pattern of the thin film is obtained by removing the photoresist pattern.

Although an ultraviolet ray such as a G-ray (wavelength 436 nm) or an I-ray (wavelength 365 nm) is typically used as the exposure light source in the photolithography technique, a far ultraviolet ray (wavelength 248 nm) with shorter wavelength is used for finer patterns.

Now, a conventional photolithography process using a far ultraviolet ray to form a metal layer pattern is described.

First, an interlayer insulating layer is formed on a structure of semiconductor substrate, i.e., a semiconductor substrate on which a device unit is formed, or a metal line layer, and a metal layer is formed on the interlayer insulating layer.

Next, a metal pattern to form a semiconductor device circuit is formed by the following process: 250 Å of an anti-reflection layer is formed on the metal layer; 50 Å of a protective oxide layer is formed on the anti-reflection layer; a photoresist layer for a far ultraviolet ray is applied, exposed, and developed to form a photoresist pattern; the exposed metal layer is etched using the photoresist pattern as a mask and the far ultraviolet ray as a light source.

At this time, the protective oxide layer is selectively formed. In FIG. 1, an example that an anti-reflection layer 2 is formed on a metal layer 1, on which a photoresist layer 3 is applied using the above conventional method, is shown. In this example, it is not unusual that the photoresist pattern is lifted because the contact layer between the photoresist layer 3 and anti-reflection layer 2 is smooth, which may result in a defective metal pattern.

DETAILED DESCRIPTION

Figure 1:
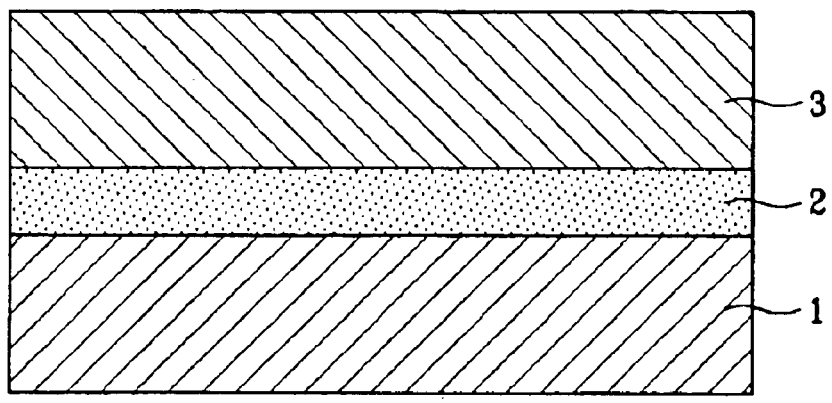
FIG. 1 is a cross sectional view showing an example structure having an anti-reflection layer formed on a metal layer and a photoresist layer applied thereon according to a conventional method.

A fabricating method of a semiconductor device may include forming a film which is an object of forming a pattern on a structure of a semiconductor substrate; forming a anti-reflection layer on the film to form a stacking structure including the film and the anti-reflection layer; performing a plasma treatment to form grooves on a upper surface of the stacking structure; forming a photoresist pattern on the stacking structure on which the grooves are formed; and etching the stacking structure using the photoresist pattern as a mask to form a stacking structure pattern.

It is preferable that the plasma treatment is performed for 15–30 seconds using $N_2O$ plasma.

Forming the photoresit pattern on the stacking structure may include applying a photoresist layer, exposing the photoresist layer to a light selectively, and developing the photoresist layer to form the photoresist pattern exposing a part of the stacking structure. In exposing the photoresist layer to a light selectively, a far ultraviolet ray may be used as a light source.

A SiOxNy layer having thickness of 200~300 Å can be used as the anti-reflection layer and the film is preferably a metal film.

During the stacking structure formation, a protective oxide layer may be formed on the anti-reflection layer after forming the anti-reflection layer to form a stacking structure including the film, the anti-reflection layer, and the protective oxide layer.

It is preferable that the protective oxide layer is formed to have thickness of equal to or less than 100 Å.

As described in greater detail below, the example semiconductor devices and fabrication method thereof described herein prevent the lift phenomenon of a photoresist pattern.

In particular, an anti-reflection layer and/or a protective oxide layer is formed on a film which is an object of pattern formation, $N_2O$ plasma treatment is performed to form grooves thereon, and a photoresist layer is applied thereon thereby improving adhesiveness between the photoresist layer and anti-reflection layer/protective oxide layer.

An example fabrication method that may be used to form the example semiconductor device described herein is described below in detail with reference to accompanying drawings.

First, an interlayer insulating layer is formed on a structure of semiconductor substrate, i.e., a semiconductor substrate on which a device unit is formed, or a metal line layer, and a metal layer is formed on the interlayer insulating layer. Next, an anti-reflection layer is formed on the metal layer to reduce the reflectivity of the metal layer, where 200~300 Å of SiOxNy is used as the anti-reflection layer. Then, $N_2O$ plasma treatment is performed on the anti-reflection layer to form grooves. It is preferable to perform the $N_2O$ plasma treatment for 15–30 seconds. When the photoresist layer is applied after forming the grooves on the anti-reflection layer, there is an advantage that the adhesiveness between the anti-reflection layer and the photoresist layer is much improved. Then, a metal pattern is formed by the following process: a photoresist pattern, which partially exposes the metal layer, is formed by applying photoresist on the anti-reflection layer, selective exposure, and development; the exposed metal layer is etched using the photoresist pattern as a mask.

Figure 2:
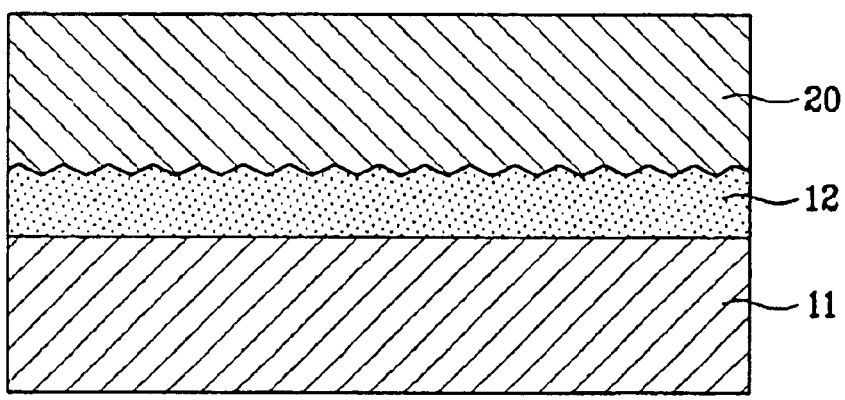
FIG. 2 is a cross sectional view showing another example structure having an anti-reflection layer formed on a metal layer and a photoresist layer applied thereon.

As shown in FIG. 2, a first example semiconductor device includes an anti-reflection layer 12 formed on a metal layer 11 on which the photoresist layer 20 is formed. Grooves are formed on the anti-reflection layer 12 which locates below the photoresist layer 20.

However, a footing phenomenon, i.e., the photoresist is not completely removed and remains due to the reaction between the anti-reflection layer and the amine radical of the far ultra-violet, the exposure light, occurs frequently. The protective oxide layer may be formed on the anti-reflection layer to prevent the footing phenomenon.

The protective oxide layer is preferably formed with thickness of equal to or less than 100 Å and 50 Å.

Figure 3A:
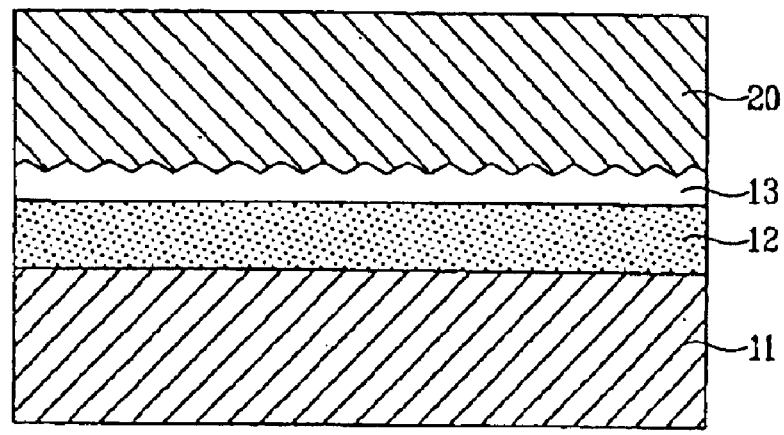
FIGS. 3A and 3B are cross sectional views showing example structures having an anti-reflection layer and a protective oxide layer formed on a metal layer in order and a photoresist layer is applied thereon.

Another example semiconductor device where a protective oxide layer is formed is shown in FIG. 3A. In FIG. 3A, an example where the anti-reflection layer 12 and the protective oxide layer 13 are applied in order on the metal layer 11, on which the photoresist layer 20 is applied is shown, where the grooves are formed on the protective oxide layer 13. However, the plasma treatment can make the grooves not only on the protective oxide layer 13 but also on the anti-reflection layer 12 beneath the protective oxide layer.

Figure 3B:
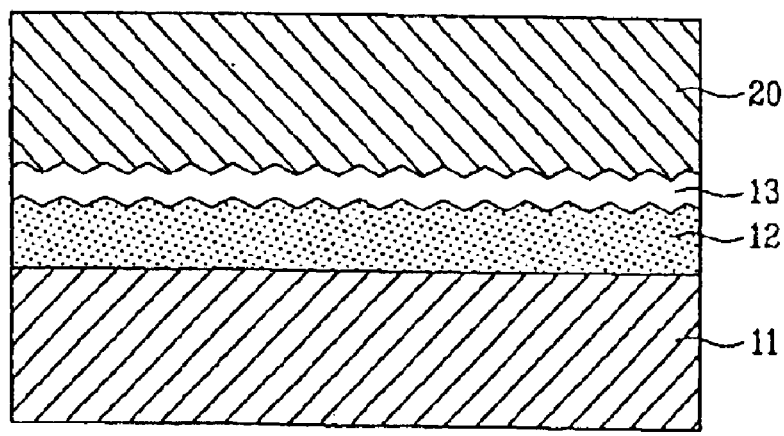

Yet another example semiconductor device where the grooves are formed on the anti-reflection layer 12 is shown in FIG. 3B. In FIG. 3B, an example where the anti-reflection layer 12 and the protective oxide layer 13 are applied in order on the metal layer 11, on which the photoresist layer 20 is applied is shown, where the grooves are formed on the protective oxide layer 13 and the anti-reflection layer 12.

As detailed above, there is an effect of preventing the phenomena that the photoresist layer pattern is lifted after the development because the adhesiveness between the anti-reflection layer or the protective oxide layer and the photoresist layer is enhanced through the following process that the grooves are formed on either the anti-reflection layer or the protective oxide layer, or both of them, by performing the $N_2O$ plasma treatment before applying the photoresist layer.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A semiconductor device comprising:
    a film pattern formed on a structure of a semiconductor substrate;
    an anti-reflection layer which is formed on the film pattern and has the same pattern as the film pattern and grooves thereon; and
    a plurality of adjacent grooves on an upper surface of the anti-reflection layer, wherein the grooves are configured to increase adhesion between the upper surface of the anti-reflection layer and a photoresist layer.

2. The semiconductor device of claim 1, wherein the grooves are formed by plasma treatment.

3. The semiconductor device of claim 2, wherein the plasma treatment is performed for 15–30 seconds using $N_2O$ plasma.

4. The semiconductor device of claim 1, wherein the same pattern of both film pattern and anti-reflection layer is formed by a photolithography process using a photoresist pattern formed on the anti-reflection layer as a mask and a far ultraviolet ray as a light source.

5. The semiconductor device of claim 1, wherein the anti-reflection layer is a $SiO_xN_y$ layer having thickness of 200~300 Å.

6. The semiconductor device of claim 1, wherein the film is a metal film.

7. The semiconductor device of claim 1, further comprising a protective oxide layer which is formed on the anti-reflection layer and has grooves thereon.

8. The semiconductor device of claim 7, wherein the protective oxide layer has thickness of equal to or less than 100 Å.

9. The semiconductor device of claim 7, wherein the grooves formed on the protective oxide layer and anti-reflection layer is formed by plasma treatment performed for 15–30 seconds using $N_2O$ plasma.

10. A semiconductor device comprising:
    a film pattern formed on a structure of a semiconductor substrate;
    an anti-reflection layer which is formed on the film pattern and has the same pattern as the film pattern and grooves thereon; and
    a protective oxide layer which is formed on the anti-reflection layer and has grooves thereon.

11. The semiconductor device of claim 10, wherein the protective oxide layer has thickness of equal to or less than 100 Å.

12. The semiconductor device of claim 10, wherein the grooves formed on the protective oxide layer and anti-reflection layer is formed by plasma treatment performed for 15–30 seconds using $N_2O$ plasma.

* * * * *